United States Patent [19]

Ishikuri

[11] Patent Number: 5,699,000
[45] Date of Patent: Dec. 16, 1997

[54] OUTPUT BUFFER CIRCUIT FOR A SEMICONDUCTOR IC

[75] Inventor: Hitoshi Ishikuri, Tokyo, Japan

[73] Assignee: NEC Corporation, Tokyo, Japan

[21] Appl. No.: 623,530

[22] Filed: Mar. 29, 1996

[30] Foreign Application Priority Data

Mar. 30, 1995 [JP] Japan ................. 7-073114

[51] Int. Cl.⁶ .............. H03K 17/16; H03K 17/687
[52] U.S. Cl. ............... 327/108; 327/170; 327/379; 327/380; 326/26; 326/27
[58] Field of Search ................. 327/108, 365, 327/376, 377, 379, 380, 381, 387, 388, 170, 442, 392, 322; 326/27, 26

[56] References Cited

U.S. PATENT DOCUMENTS 4,954,729 9/1990 Urai ........................... 326/27
5,565,715 10/1996 Doluca ....................... 327/108
5,568,081 10/1996 Lui et al. ..................... 327/108

FOREIGN PATENT DOCUMENTS 402096428A 4/1990 Japan ........................ 326/27
3127511 5/1991 Japan .

Primary Examiner—Timothy P. Callahan
Assistant Examiner—Dinh T. Le
Attorney, Agent, or Firm—Sughrue, Mion, Zinn, Macpeak & Seas, PLLC

[57] ABSTRACT

In an output buffer circuit for a semiconductor integrated circuit, the waveform of an input to the gate of each output transistor slowly changes not only when the transistor is turned on but also when it is turned off.

6 Claims, 6 Drawing Sheets

OUTPUT BUFFER CIRCUIT FOR A SEMICONDUCTOR IC

BACKGROUND OF THE INVENTION

The present invention relates to an output buffer circuit for a semiconductor IC (Integrated Circuit) and, more particularly, to a slew rate buffer circuit.

An output buffer circuit for the above application is in disclosed in Japanese Patent Laid-Open Publication No. 3-127511 by way of example. The buffer circuit taught in this document has a serial connection of a p-channel MOS (Metal Oxide Semiconductor) transistor and an n-channel MOS transistor connected between a power source and ground. The junction of the two transistors is connected to an output terminal. The buffer circuit is so controlled as to prevent an excessive current from sharply flowing to the output terminal when any of the transistors is turned on. For this purpose, an input signal to the gate of the transistor to be turned on has its waveform slowly changed. However, when the transistor is to be turned off, the input to the gate of the transistor is not controlled at all. Hence, it is likely that the waveform of the input sharply changes and causes an excessive current to flow through a power source line or a ground line included in the IC.

SUMMARY OF THE INVENTION

It is therefore an object of the present invention to provide an output buffer circuit for a semiconductor IC and capable of changing the waveform of an input to the gate of its transistor slowly not only when the transistor is turned on but also when it is turned off.

In accordance with the present invention, an output buffer circuit has an output buffer section having a serial connection of a first and a second transistor connected between a first and a second power source. A first timing control section causes, in response to a signal applied to an input terminal, the first transistor to turn on following a first predetermined period of time after the second transistor turns off. A second timing control section causes, in response to a signal applied to the input terminal, the second transistor to turn on following a second predetermined period of time after the first transistor tuns off. A first slew rate control section transfers a signal applied to the input terminal to the control input terminal of the first transistor while causing the signal to slowly change. A second slew rate control section transfers a signal applied to the input terminal to the control input terminal of the second transistor while causing the signal to slowly change.

Also, in accordance with the present invention, an output buffer circuit has an output buffer section having a serial connection of a first and a second transistor connected between a high potential power source and a low potential power source. The first and second transistors respectively turn on when an input signal is in a logical low level and when it is in a logical high level. The junction of the first and second transistors is connected to an output terminal. A first timing control section causes the first transistor to turn on following a third predetermined period of time after the second transistor turns off. A second timing control section causes the second transistor to turn on following a fourth predetermined period of time after the first transistor tuns off. A first slew rate control section causes an input signal to the gate of the first transistor to slowly change when the input signal to the gate changes from the logical low level to the logical high level and changes from the logical high level to the logical low level. A second slew rate control section causes an input signal to the gate of the second transistor to slowly change when the input signal to the gate changes from the logical low level to the logical high level and changes from the logical high level to the logical low level.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
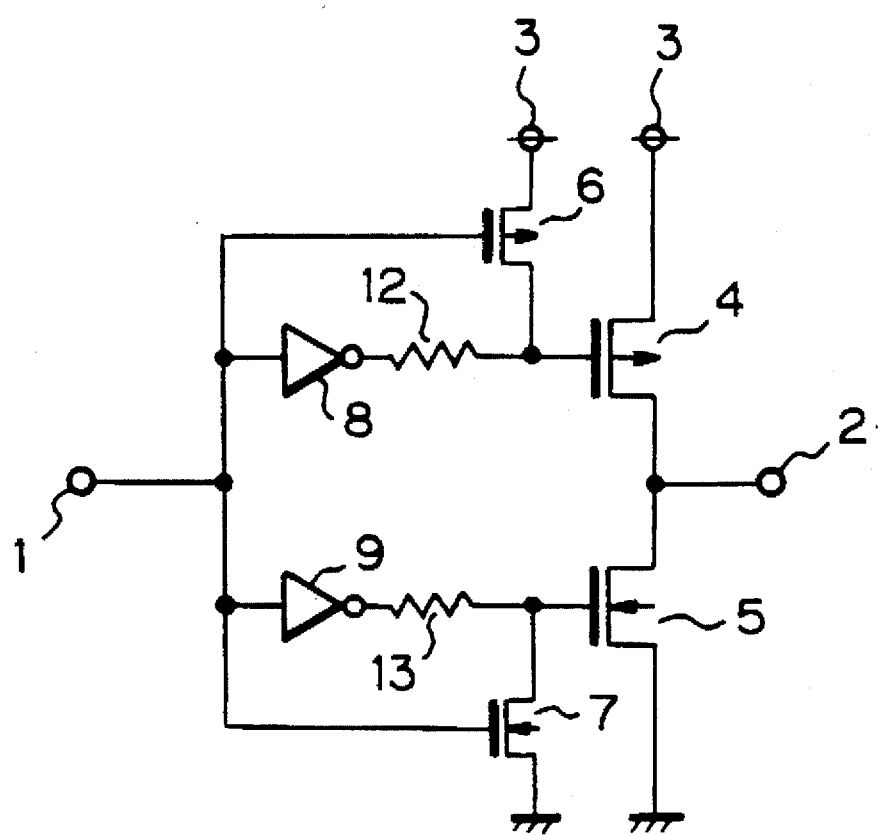
FIG. 1 is a circuit diagram showing a conventional output buffer circuit.

To better understand the present invention, a brief reference will be made to a conventional output buffer circuit, shown in FIG. 1. As shown, the buffer circuit has an input terminal 1 to which a signal S1 generated within a semiconductor IC including the buffer circuit is applied. An output signal S2 derived from the input signal S1 is fed to the outside of the IC via an output terminal 2. A p-channel MOS or p-MOS transistor 4 and an n-channel MOS or n-MOS transistor 5 are serially connected between a power source 3 and ground. The output terminal 2 is connected to the junction of the two transistors 4 and 5. The input terminal 1 is connected to the gates of auxiliary p-MOS transistors 6 and 7 and the input terminals of inverters 8 and 9. The output terminal of the inverter 8 is connected to one end of a resistor 12 while the output terminal of the inverter 9 is connected to one end of a resistor 13. The other end of the resistor 12 is connected to the gate of the p-MOS transistor 4 while the other end of the resistor 13 is connected to the gate of the n-MOS transistor 5. The auxiliary p-MOS transistor 6 has its source and drain connected to the power source 3 and the gate of the transistor 4, respectively. Likewise, the auxiliary n-MOS transistor 7 has its source and drain connected to ground and the gate of the n-MOS transistor 5, respectively.

Figure 2:
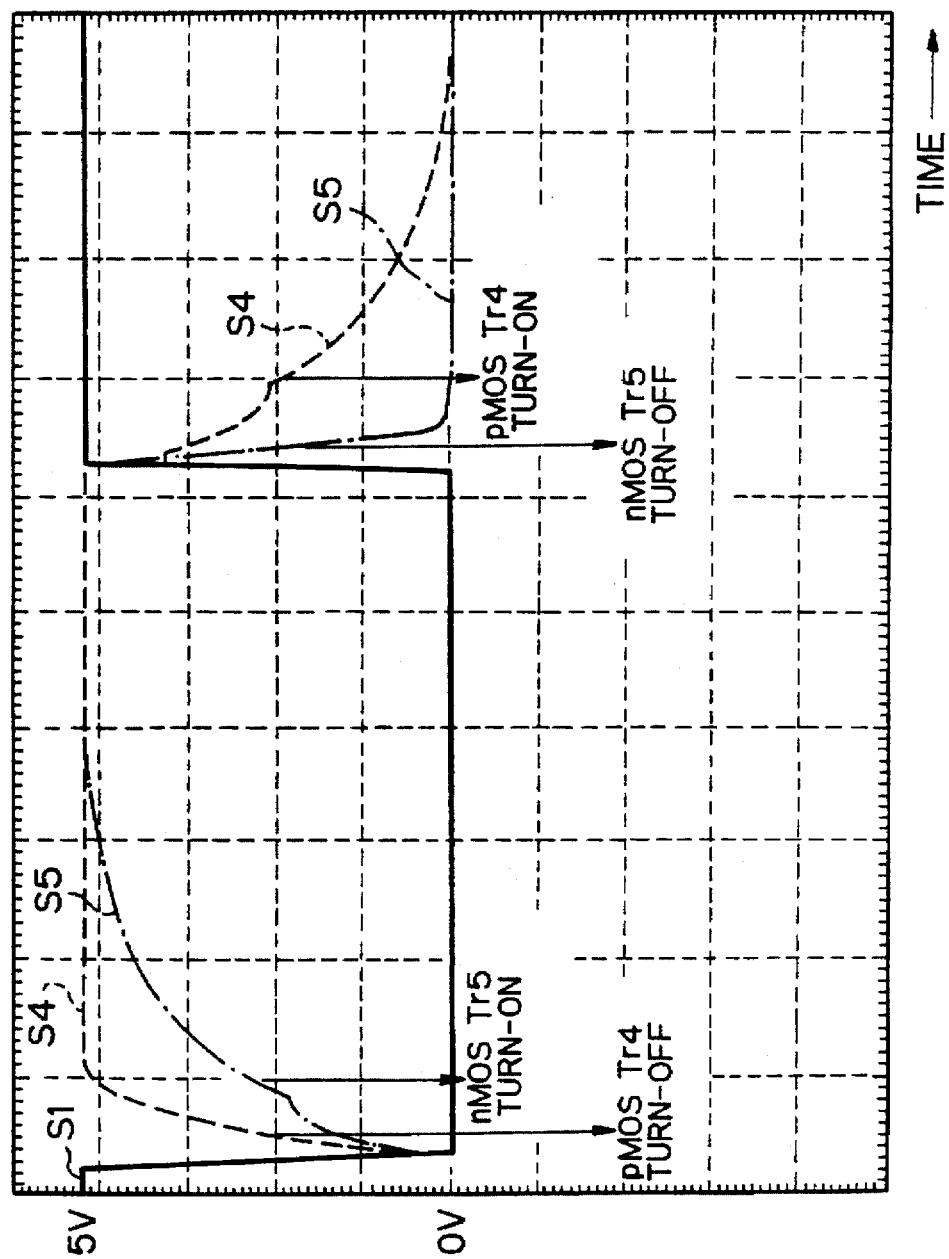
FIG. 2 shows waveforms representative of the operation of the buffer circuit of FIG. 1.

In the above configuration, when the signal S1 goes high, signals of low level are applied to the gate of the transistor 4 and the gate of the transistor 5. Specifically, as shown in FIG. 2, when the signal S1 changes from the low level to the high level, the auxiliary transistor 7 turns on while the auxiliary transistor 6 turns off. As a result, a signal of low level is applied to the gate of the transistor 5 on the conduction of the transistor 7. At the same time, a signal S4 slowly changing from the high level to the low level is applied to the gate of the transistor 4 via the inverter 8 and resistor 12. Likewise, when the signal S1 goes low, a signal of high level is applied to the gate of the transistor 4 on the conduction of the transistor 6 while a signal S5 slowing changing from the low level to the high level is applied to the gate of the transistor 5 via the inverter 9 and resistor 13. In this manner, when the transistors 4 and 5 are rendered conductive, their associated input waveforms slowly change.

Figure 3:
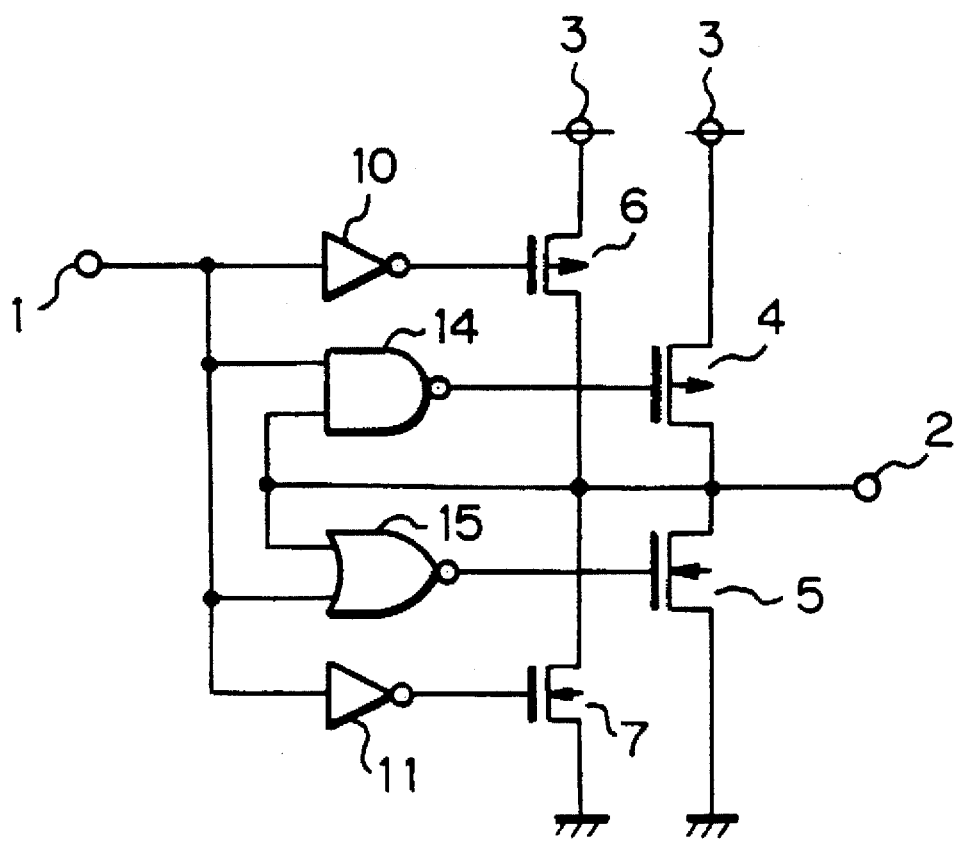
FIG. 3 is a circuit diagram showing another conventional output buffer circuit.

FIG. 3 shows another conventional output buffer circuit which is taught in previously mentioned Japanese Patent Laid-Open Publication No. 3-127511. In FIG. 3, the same constituent pans as the parts shown in FIG. 1 are designated by like reference numerals. As shown, the serial connection of the p-MOS transistor 4 and n-MOS transistor 5 is connected between the power source 3 and ground. The output terminal 2 is connected to the junction of the transistors 4 and 5. The serial connection of the auxiliary p-MOS transistor 6 and auxiliary n-MOS transistor 7 is connected between the power source 3 and ground. The output terminal 2 is connected to the junction of the auxiliary transistors 6 and 7. The input terminal 1 is connected to the input terminals of inverters 10 and 11. The output terminal of the inverter 10 is connected to the gate of the transistor 6 while the output terminal of the inverter 11 is connected to the gate of the transistor 7. The input terminal 1 and output terminal 2 are connected to the input terminal of a bi-input NAND gate 14 and to the input terminal of a bi-input NOR gate 15. The output terminal of the NOR gate 15 is connected to the gate of the transistor 5. The output terminal of the NAND gate 14 is connected to the gate of the transister 4.

The circuit of FIG. 3, like the circuit of FIG. 1, is designed such that when the transistors 4 and 5 turn on, an excessive current is prevented from sharply flowing to the output terminal 2.

Figure 4:
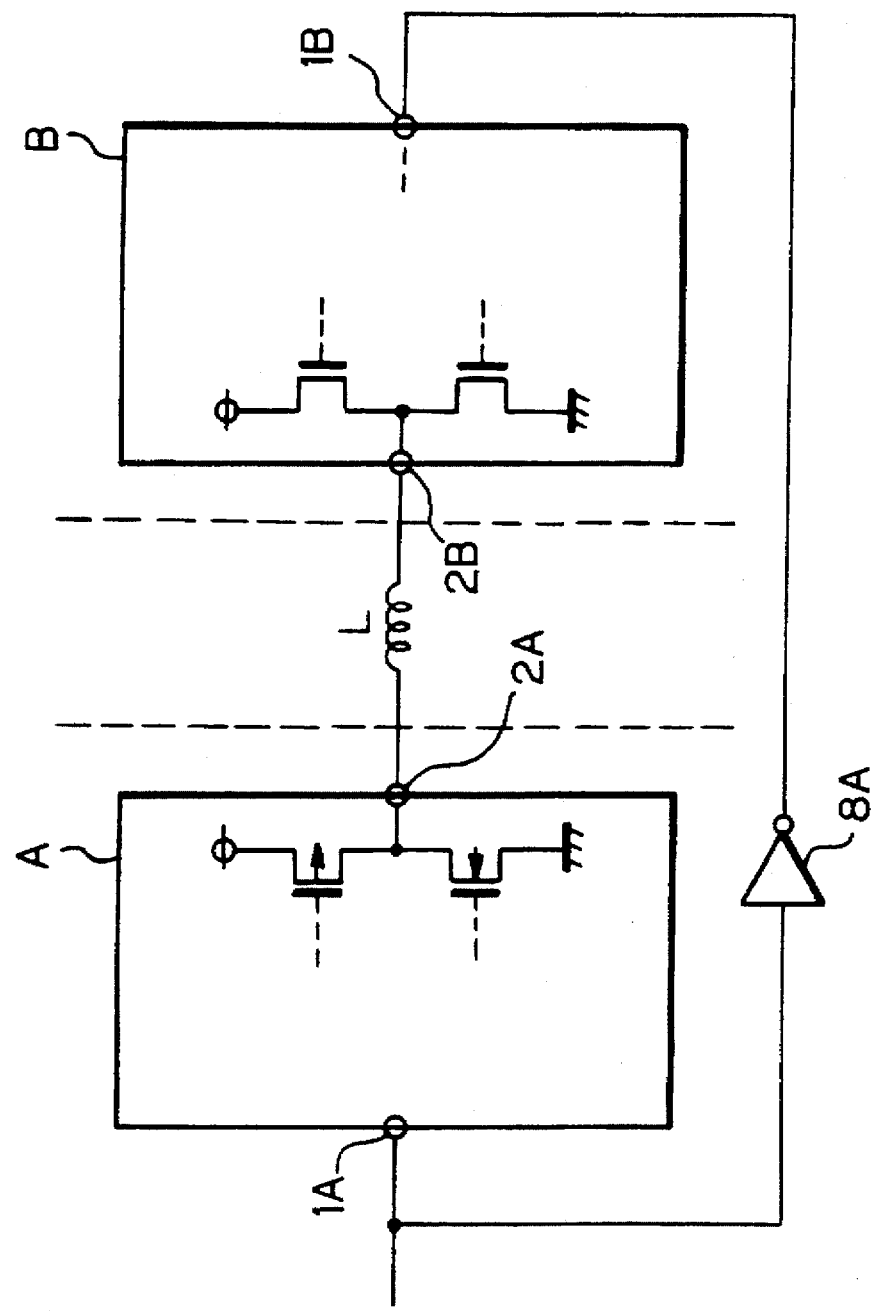
FIG. 4 shows a specific configuration wherein two buffer output circuits are used to drive a load having a great inductance component.

However, the conventional circuits described above have the following problem left unsolved. As shown in FIG. 4, assume that two output buffer circuits A and B have their output terminals 2A and 2B connected to the opposite ends of a coil or similar load L having a great inductance component. When the circuits A and B drive the load L, their transistors are sharply turned off with the result that a counter electromotive force is generated by the inductance component of the load L. As a result, a voltage higher than the power source voltage or lower than the ground voltage appears for a moment and causes an excessive current to flow through a power source line or a ground line included in the IC.

Figure 5:
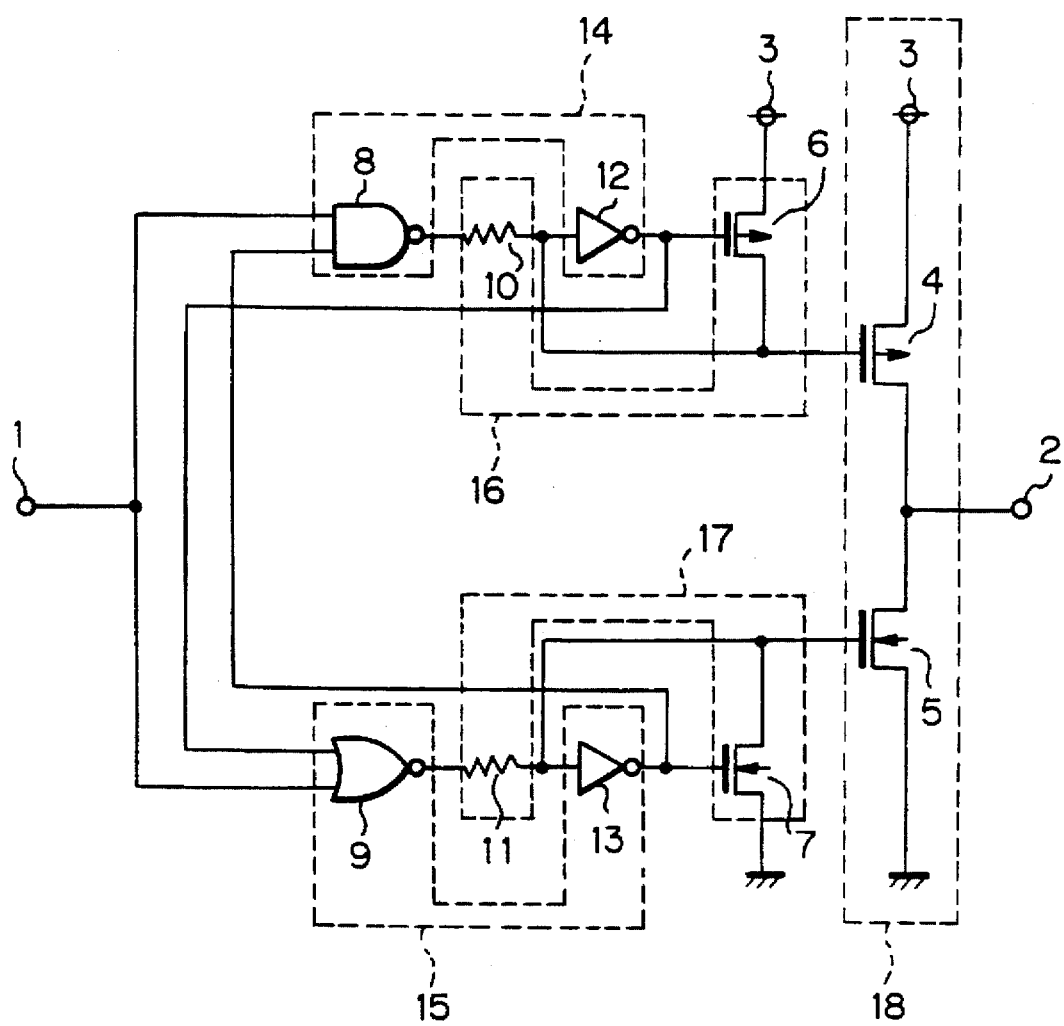
FIG. 5 is a circuit diagram showing an output buffer circuit embodying the present invention.

Referring to FIG. 5, an output buffer circuit embodying the present invention will be described. In FIG. 5, the same constituent parts as the part shown in FIGS. 1 and 3 are designated by like reference numerals. As shown, the buffer circuit has an input terminal 1 to which a signal S1 generated within a semiconductor IC including the buffer circuit applied. An output signal S2 derived from the input signal S1 is fed to the outside of the IC via an output terminal 2. A serial connection of a p-MOS transistor 4 and an n-MOS transistor 5 is connected between a power source 3 and ground. An auxiliary p-MOS transistor 6 has a source connected to the power source 3 and has a drain connected to the gate of the transistor 4. An auxiliary n-MOS transistor 7 has a source connected to ground and has a drain connected to the gate of the transistor 5. The input terminal 1 is connected to one input of a bi-input NAND gate 8 and one input of a bi-input NOR gate 9. The output terminals of the NAND gate 8 and NOR gate 9 are respectively connected to one end of a resistor 10 and one end of a resistor 11. The other end of the resistor 10 is connected to the input terminal of an inverter 12 having a high threshold voltage ($V_T$) and the gate of the transistor 4. The other end of the resistor 11 is connected to the input terminal of a low $V_T$ inverter 13 and the gate of the transistor 5. The output terminal of the inverter 12 is connected to the other input terminal of the NOR gate 9 and the gate of the transistor 6. The output terminal of the inverter 13 is connected to the other input terminal of the NAND gate 8 and the gate of the transistor 7.

In the illustrative embodiment, the gates of the transistors 4 and 5 serially connected between the power source 3 and ground are assumed to be input terminals. Then, the transistors 4 and 5 constitute an output buffer section 18. The resistor 10 and auxiliary transistor 6 constitute a first slew rate control section 16 for causing the input signal to the gate of the transistor 4 to slowly change. The resistor 11 and auxiliary transistor 7 constitute a second slew rate control section 17 for causing the input signal to the gate of the transistor 5 to slowly change. The NAND gate 8 and high $V_T$ inverter 12 constitute a first timing control section 14 for delaying the turn-on of the transistor 4 relative to the turn-on of the transistor 5 by a preselected period of time and thereby reducing a straight current between the power source 3 and ground in the output buffer section 18. Likewise, the NOR gate 9 and low $V_T$ inverter 13 constitute a second timing control circuit 15 for delaying the turn-on of the transistor 5 relative to the turn-on of the transistor 6 and thereby reducing a straight current in the output buffer section 18.

In operation, assume that the signal S 1 input to the input terminal 1 is initially in the low level. Then, signals of high level are applied to the gate of the transistors 4 and 5 constituting the output buffer section 18, i.e., the transistors 4 and 5 are turned off and turned on, respectively. In this condition, the potential on the output terminal 2 is in the low level. The two inputs of the NAND gate 8 and those of the NOR gate 9 are held in the low level. Hence, signals of low level are fed to the gates of the transistors 6 and 7 and maintain the transistors 6 and 7 conductive and nonconductive, respectively.

When the signal S1 goes high, the output signal of the NOR gate 9 immediately goes low and reaches the gate of the transistor 5 via the resistor 11 while slowly changing due to the resistor 11. Further, the output signal of the resistor 11 is delayed by the low $V_T$ inverter 13 more than when its level changes from the low level to the high level. As a result, a signal of high level and having such a delay appears on the output of the inverter 13. The output signal of the inverter 13 turns on the transistor 7 and causes the output signal of the NAND gate 8 to change from the high level to the low level. The resulting output of the NAND gate 8 is caused to slowly change by the resistor 10. The output signal of the resistor 10 is routed through the inverter 12 to the gate of the transistor 6 and turns off the transistor 6. In addition, the output signal of the resistor 10 is fed to the gate of the transistor 4.

Figure 6:
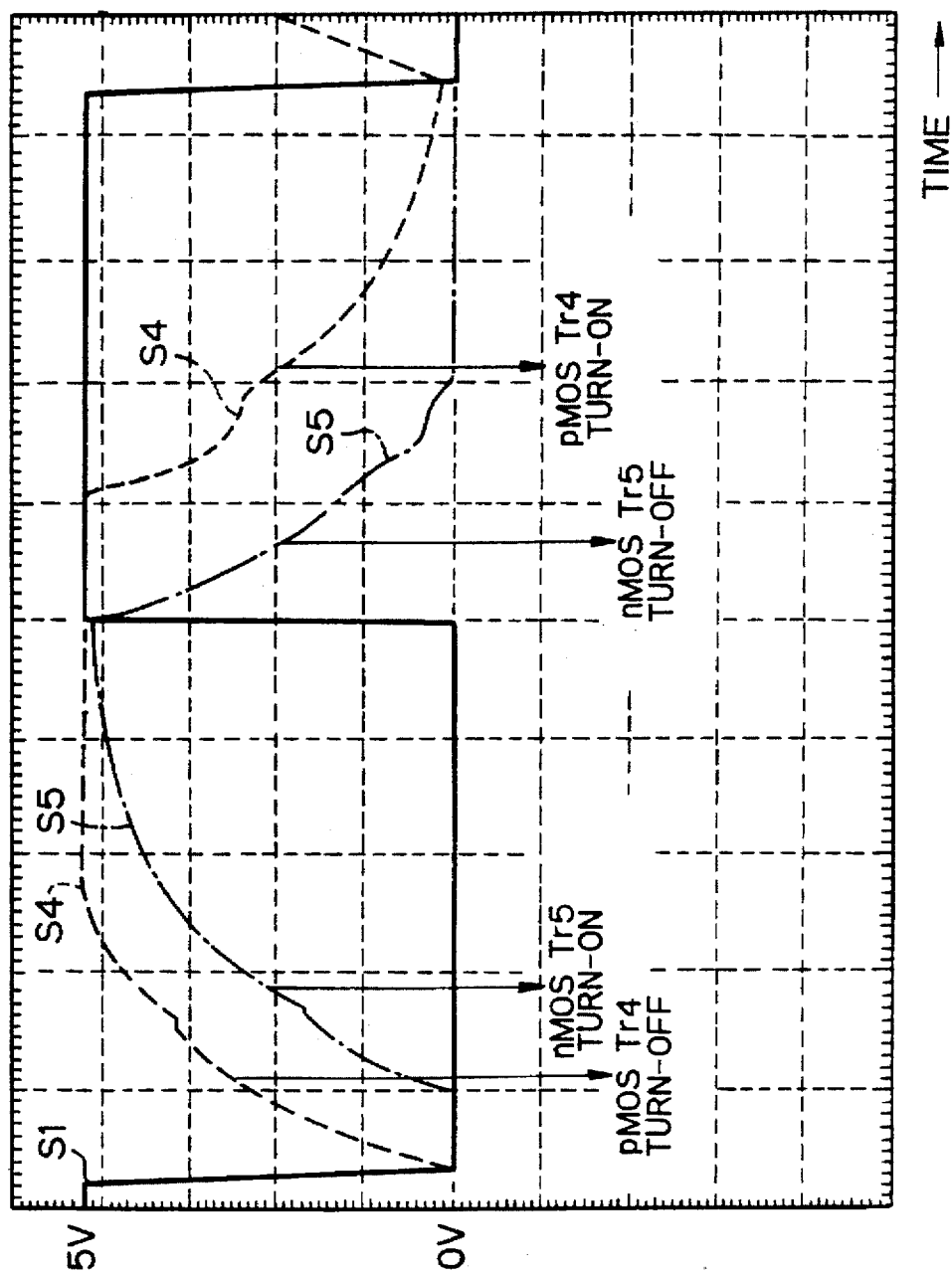
FIG. 6 shows waveforms demonstrating a specific operation of the embodiment.

More specifically, as shown in FIG. 6, when the signal S1 changes from the low level to the high level, it causes the transistor 5 to slowly turn off and then causes the transistor 4 to slowly turn on with a preselected delay.

Likewise, when the signal S1 changes from the high level to the low level, the output signal of the NAND gate 8 immediately changes with the result that the signal of high level output from the resistor 10 arrives at the gate of the transistor 4. On the other hand, the output signal of the high $V_T$ inverter 12 also receiving the output signal of the resistor 10 turns on the transistor 6 with a greater delay than when its level changes from the high level to the low level. Further, the output signal of the inverter 12 is applied to the NOR gate 9.

By the above procedure, when the signal S1 goes low, it causes the transistor 4 to slowly turn off and then causes the transistor 5 to slowly turn on with a preselected delay, as also shown in FIG. 6.

The auxiliary transistors 6 and 7 respectively serve to further slow down the input waveforms when the transistors 4 and 5 are rendered conductive. To further enhance this effect, a suitable resistor may be added between each of the resistors 10 and 11 and each of the transistors 4 and 5.

In summary, in accordance with the present invention, when two buffer circuits are used to drive the opposite ends of a coil or similar load having a great inductance component, transistors included in the buffer circuits are slowly turned off. This prevents an excessive current from flowing through a power source line or a ground line due to the inductance. Further, the noise of transistor lines is reduced, as in a conventional slew rate buffer circuit. In addition, the transistors can be turned on and turned off at adequate timings which reduce straight currents output buffer sections.

Various modifications will become possible for those skilled in the art after receiving the teachings of the present disclosure without departing from the scope thereof.

What is claimed is:

1. An output buffer circuit comprising:

an output buffer section comprising a serial connection of a first and a second transistor connected between a first and a second power source;

a first timing control section causing, in response to a first signal applied to an input terminal, said first transistor to turn on following a predetermined period of time after said second transistor turns off;

a second timing control section causing, in response to said first signal applied to said input terminal, said second transistor to turn on following a predetermined period of time after said first transistor turns off;

a first slew rate control section for transferring a second signal received from said first timing control section to a control input terminal of said first transistor while causing said second signal to slowly change; and a second slew rate control section for transferring a third signal received from said second timing control section to a control input terminal of said second transistor while causing said third signal to slowly change.

2. The output buffer circuit defined by claim 1, wherein said first slew rate control section comprises a first resistor having a first terminal which receives the output of said first timing control section and a second terminal which outputs said second signal to said gate of said first transistor, and wherein said second slew rate control section comprises a second resistor having a first terminal which receives the output of said second timing control section and a second terminal which outputs said third signal to said gate of said second transistor.

3. The output buffer circuit defined by claim 1, wherein said first timing control section outputs a fourth signal to said second timing control section, and wherein said second timing control section outputs a fifth signal to said first timing control section.

4. An output buffer circuit comprising:

an output buffer section comprising a serial connection of a first and a second transistor connected between a high potential power source and a low potential power source, wherein said first and second transistors turn on when a first input signal to said output buffer circuit is in a logical high level and when said first input signal is in a logical low level, respectively, and wherein a junction of said first and second transistors is connected to an output terminal;

a first timing control section which, in response to said first input signal, causes said first transistor to turn on following a predetermined period of time after said second transistor turns off;

a second timing control section which, in response to said first input signal, causes said second transistor to turn on following a predetermined period of time after said first transistor turns off;

a first slew rate control section which receives a first output signal of said first timing control section and causes a second input signal to a gate of said first transistor to slowly change when said second input signal to said gate changes from the logical low level to the logical high level and changes from the logical high level to the logical low level; and a second slew rate control section which receives a second output signal of said second timing control section and causes a third input signal to a gate of said second transistor to slowly change when said third input signal to said gate changes from the logical low level to the logical high level and changes from the logical high level to the logical low level.

5. The output buffer circuit defined by claim 4, wherein said first slew rate control section comprises a first resistor having a first terminal which receives the first output signal of said first timing control section and a second terminal which outputs said second input signal to said gate of said first transistor, and wherein said second slew rate control section comprises a second resistor having a first terminal which receives the second output signal of said second timing control section and a second terminal which outputs said third input signal to said gate of said second transistor.

6. The output buffer circuit defined by claim 4, wherein said first timing control section outputs a third output signal to said second timing control section, and wherein said second timing control section outputs a fourth output signal to said first timing control section.

* * * * *